United States Patent
Lu et al.

(10) Patent No.: US 10,566,192 B2
(45) Date of Patent: Feb. 18, 2020

(54) TRANSISTOR STRUCTURE HAVING BURIED ISLAND REGIONS

(71) Applicant: Cambridge Electronics, Inc., Cambridge, MA (US)

(72) Inventors: Bin Lu, Boston, MA (US); Tomas Palacios, Belmont, MA (US); Ling Xia, Somerville, MA (US); Mohamed Azize, Medford, MA (US)

(73) Assignee: CAMBRIDGE ELECTRONICS, INC., Cambridge, MA (US)

( * ) Notice: Subject to any disclaimer, the term of this patent is extended or adjusted under 35 U.S.C. 154(b) by 71 days.

(21) Appl. No.: 14/706,350

(22) Filed: May 7, 2015

(65) Prior Publication Data

US 2015/0349124 A1   Dec. 3, 2015

Related U.S. Application Data

(60) Provisional application No. 61/989,635, filed on May 7, 2014.

(51) Int. Cl.
*H01L 21/02* (2006.01)
*H01L 29/10* (2006.01)
(Continued)

(52) U.S. Cl.
CPC .... *H01L 21/02565* (2013.01); *H01L 21/0254* (2013.01); *H01L 21/02527* (2013.01); *H01L 21/02529* (2013.01); *H01L 21/02532* (2013.01); *H01L 21/283* (2013.01); *H01L 29/0619* (2013.01); *H01L 29/0646* (2013.01); *H01L 29/1033* (2013.01); *H01L 29/1037* (2013.01); *H01L 29/1041* (2013.01); *H01L 29/1054* (2013.01); *H01L 29/4236* (2013.01); *H01L 29/66462* (2013.01); *H01L 29/7786* (2013.01);
(Continued)

(58) Field of Classification Search
CPC ............ H01L 29/1066; H01L 29/1086; H01L 29/1037; H01L 29/1054; H01L 29/4236; H01L 29/66462; H01L 29/0623; H01L 29/404; H01L 29/407; H01L 29/0649; H01L 29/1033; H01L 29/1041; H01L 29/408; H01L 21/0254; H01L 21/02565
See application file for complete search history.

(56) References Cited

U.S. PATENT DOCUMENTS 4,959,697 A * 9/1990 Shier .................. H01L 29/1058
257/279
5,675,164 A * 10/1997 Brunner .............. H01L 21/0273
257/331
(Continued)

*Primary Examiner* — Tuan A Hoang
(74) *Attorney, Agent, or Firm* — Mayer & Williams, PC; Stuart H. Mayer

(57) ABSTRACT

A semiconductor device such as a transistor includes a source region, a drain region, a semiconductor region, at least one island region and at least one gate region. The semiconductor region is located between the source region and the drain region. The island region is located in the semiconductor region. Each of the island regions differs from the semiconductor region in one or more characteristics selected from the group including resistivity, doping type, doping concentration, strain and material composition. The gate region is located between the source region and the drain region covering at least a portion of the island regions.

9 Claims, 8 Drawing Sheets

(51) Int. Cl.
 H01L 29/861 (2006.01)
 H01L 21/283 (2006.01)
 H01L 29/66 (2006.01)
 H01L 29/423 (2006.01)
 H01L 29/06 (2006.01)
 H01L 29/778 (2006.01)
 H01L 29/78 (2006.01)
 H01L 29/16 (2006.01)
 H01L 29/20 (2006.01)
 H01L 29/22 (2006.01)
 H01L 29/205 (2006.01)

(52) U.S. Cl.
 CPC ............ H01L 29/78 (2013.01); H01L 29/861 (2013.01); *H01L 29/0623* (2013.01); *H01L 29/0649* (2013.01); *H01L 29/1602* (2013.01); *H01L 29/1608* (2013.01); *H01L 29/2003* (2013.01); *H01L 29/205* (2013.01); *H01L 29/22* (2013.01); *H01L 29/42368* (2013.01)

(56) References Cited

U.S. PATENT DOCUMENTS

| | | | | |
|---|---|---|---|---|
| 6,097,063 A * | 8/2000 | Fujihira | ............... | H01L 29/0619 257/139 |
| 7,629,631 B2 * | 12/2009 | Yilmaz | ............... | H01L 29/0634 257/141 |
| 2005/0167742 A1 * | 8/2005 | Challa | ................ | H01L 21/3065 257/328 |
| 2006/0220155 A1 * | 10/2006 | Furuta | ................ | H01L 29/1037 257/409 |
| 2007/0249119 A1 * | 10/2007 | Saito | .................. | H01L 29/1066 438/253 |
| 2008/0224183 A1 | 9/2008 | Nawaz | | |
| 2009/0085101 A1 * | 4/2009 | Huang | ................ | H01L 29/063 257/328 |
| 2009/0278197 A1 * | 11/2009 | Ohta | ................ | H01L 21/28587 257/330 |
| 2010/0159639 A1 | 6/2010 | Sakata | | |
| 2011/0240991 A1 | 10/2011 | Yamazaki | | |
| 2011/0254010 A1 * | 10/2011 | Zhang | ................ | H01L 29/0623 257/66 |
| 2012/0043593 A1 * | 2/2012 | Zhong | ............... | H01L 21/82381 257/288 |
| 2012/0153390 A1 * | 6/2012 | Mishra | ............... | H01L 29/0657 257/339 |
| 2013/0168771 A1 * | 7/2013 | Wu | ..................... | H01L 27/1211 257/351 |
| 2013/0214354 A1 * | 8/2013 | Chan | ................ | H01L 29/66681 257/339 |
| 2013/0248876 A1 * | 9/2013 | Yaegashi | ............. | H01L 29/0649 257/76 |
| 2014/0147977 A1 * | 5/2014 | Charles | ............ | H01L 29/66431 438/172 |
| 2014/0151766 A1 * | 6/2014 | Eneman | ............. | H01L 29/1054 257/288 |
| 2014/0217501 A1 * | 8/2014 | Sulistyanto | ......... | H01L 29/7816 257/343 |
| 2014/0264564 A1 * | 9/2014 | Cheng | ................ | H01L 29/7827 257/330 |

* cited by examiner

TRANSISTOR STRUCTURE HAVING BURIED ISLAND REGIONS

BACKGROUND

The ability to modify the threshold voltage in a transistor is highly desirable to design complex circuits. In Silicon MOSFETs, threshold voltage is commonly tuned by the doping density in the channel. However, the change in threshold voltage in unipolar transistors is not easy. For example, the threshold voltage of unipolar n-type transistors of III-V and III-Nitride semiconductors is typically negative. Therefore these transistors are depletion-mode or normally-on devices. Although enhancement-mode or normally-off transistors are highly desirable in many applications, it can be difficult to change the threshold voltage of these transistors to positive values.

This invention describes a new structure with island regions in the gate region of a transistor. This new structure is useful for tuning the threshold voltage.

SUMMARY

In accordance with one aspect of the disclosed subject matter, a transistor is provided that includes a source region, a drain region, a semiconductor region, at least one island region and at least one gate region. The semiconductor region is located between the source region and the drain region. The island region is located in the semiconductor region. Each of the island regions differs from the semiconductor region in one or more characteristics selected from the group including resistivity, doping type, doping concentration, strain and material composition. The gate region is located between the source region and the drain region covering at least a portion of the island regions.

In accordance with another aspect of the disclosed subject matter, a diode is provided that includes a cathode region, a semiconductor region, at least one island region and an anode region. The island region is located in the semiconductor region. Each of the island regions differs from the semiconductor region in one or more characteristics selected from the group including resistivity, doping type, doping concentration, strain and material composition. The anode region covers at least a portion of the island regions.

In accordance with yet another aspect of the disclosed subject matter, a method is provided for forming a transistor having a tailored threshold voltage. In accordance with the method, at least one island region is formed in a semiconductor region. The island region is formed so that it has at least one structural and/or compositional characteristic that differs from the at least one structural and/or compositional characteristic of the semiconductor region so that the transistor has the tailored threshold voltage. A conductive electrode is formed which covers at least a portion of the island regions.

DETAILED DESCRIPTION

In the following description, numerous specific details are set forth in order to provide a thorough understanding of exemplary embodiments or other examples described herein. However, it will be understood that these embodiments and examples may be practiced without the specific details. In other instances, well-known methods and procedures have not been described in detail, so as not to obscure the following description. Further, the embodiments disclosed are for exemplary purposes only and other embodiments may be employed in lieu of, or in combination with, the embodiments disclosed.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

Figure 1:
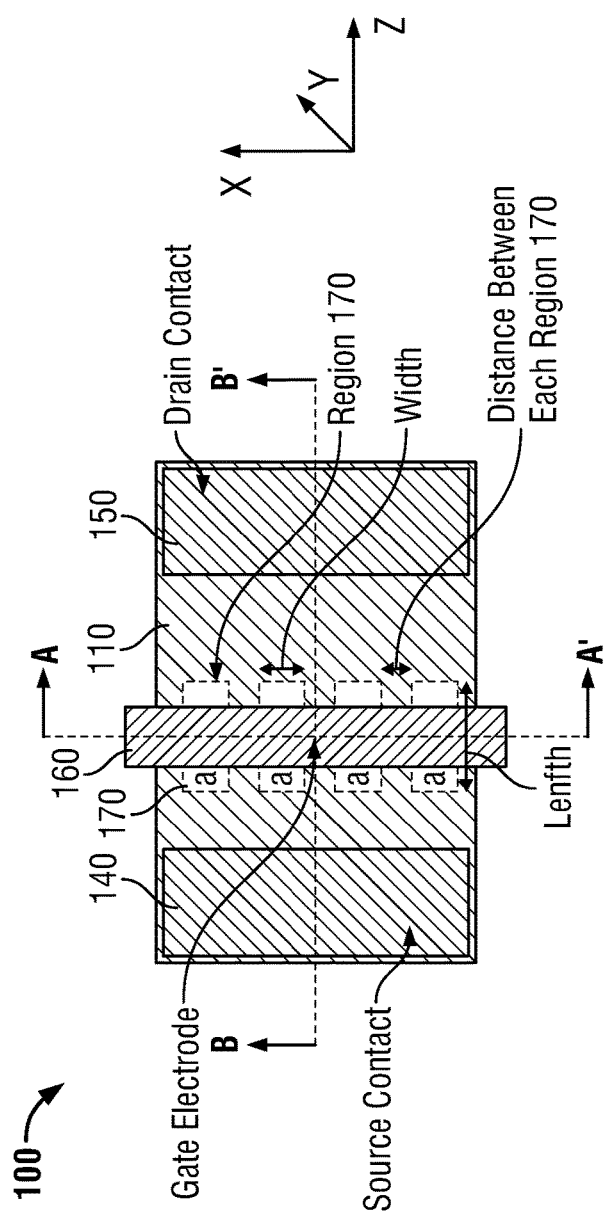
FIG. 1 shows a plan view of one embodiment of a semiconductor device constructed in accordance with the teachings presented herein.
Figure 2:
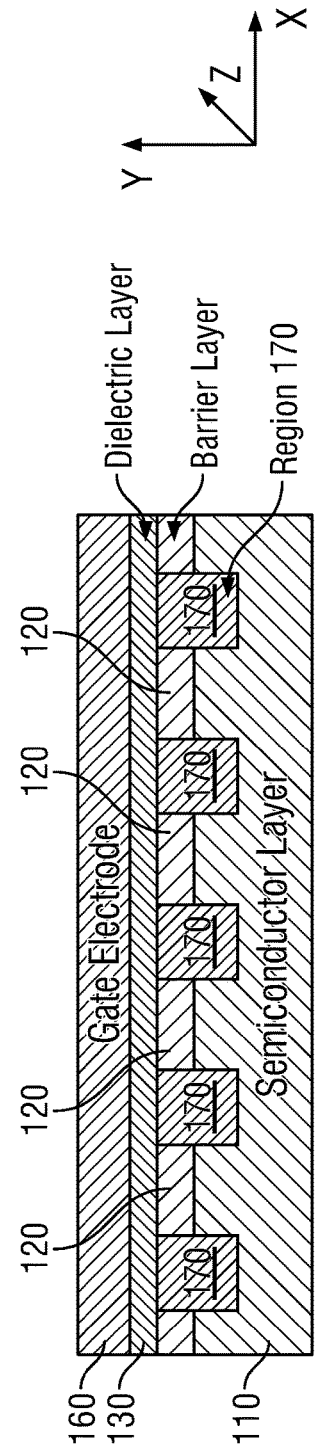
FIGS. 2 and 3 show cross-sectional views of semiconductor device of FIG. 1 taken along lines A-A' and B-B', respectively.
Figure 3:
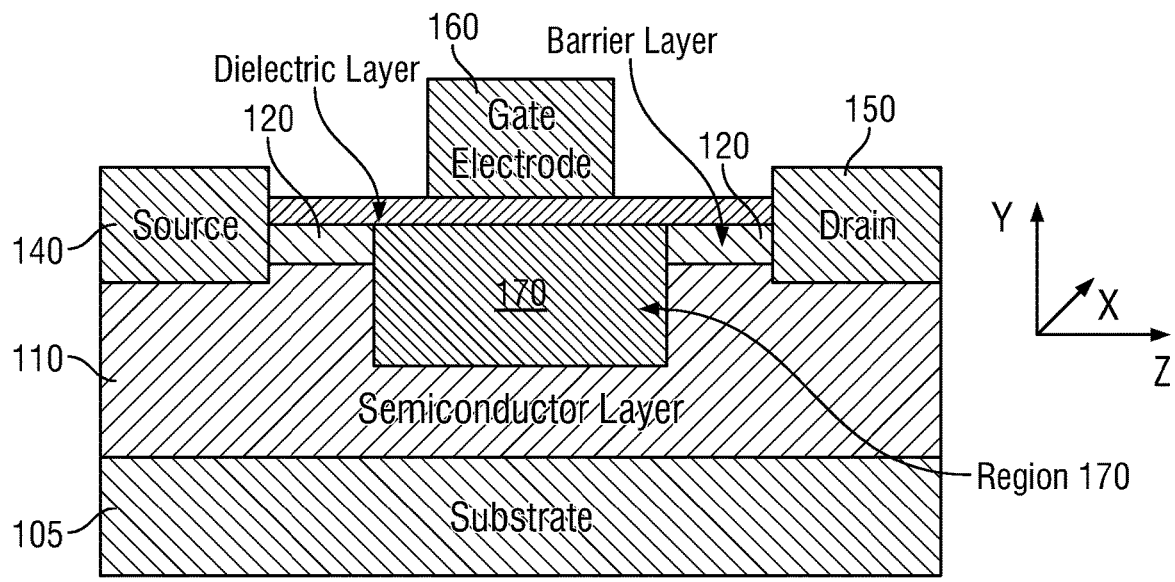

FIG. 1 shows a plan view of one embodiment of a semiconductor device 100 constructed in accordance with the teachings presented herein. FIGS. 2 and 3 show cross-sectional views of semiconductor device 100 taken along lines A-A' and B-B', respectively. In FIGS. 1-3 and the FIGs. that follow like elements are denoted by like reference numerals. The semiconductor device 100 in this illustrative embodiment is depicted as a transistor that is operational in an enhancement mode or a depletion-mode. However, the teachings presented herein are equally applicable to other semiconductor devices such as diodes and various power and RF devices and is not limited to the particular devices described below.

Referring to FIGS. 1-3, semiconductor device 100 includes a substrate 105 (shown in FIG. 3 only), semiconductor layer 110 disposed on substrate 105, an optional barrier layer 120 disposed over semiconductor layer 110 and an optional dielectric layer 130 disposed over barrier layer 120.

Source and drain contacts 140 and 150, respectively, are disposed in a recess extending through the barrier layer 120 and dielectric layer 130 and into the semiconductor layer 110. In this way the source and drain contacts 140 and 150 contact the semiconductor layer 110. A gate electrode 160 is disposed over the dielectric layer 130 and is located between the source and drain contacts 140 and 150.

In some embodiments semiconductor layer 110 may be an epitaxial layer that is formed on the substrate 105. In other embodiments the semiconductor layer 110 is bulk-like and need not be epitaxial. In these latter embodiments the semiconductor layer 110 may itself act as the substrate. As used herein, the term "substrate" refers to a free-standing, self-supporting structure and is not to be construed as a thin film layer that is formed on a free-standing, self-supporting structure.

A series of n (n≥1) island regions 170 are located in the semiconductor layer 110 between the source contact 140 and drain contact 150. At least a portion of each island region 170 extends underneath or below the gate electrode 160. More specifically, if the gate electrode 160 extends in the lateral direction (e.g., the x-direction in FIGS. 1-3), then in some embodiments each island region 170 extends in a direction perpendicular to the lateral direction (e.g., the z-direction in FIGS. 1-3). In some embodiments, the gate region (including the gate electrode 160, dielectric layer 130 and possibly barrier layer 120) covers the entirety of island regions 170. In the embodiment shown in FIG. 2 the island regions 170 extend through the barrier layer 120 and may contact the dielectric layer 130.

The island regions 170 will have any suitable cross-section shape such as square, rectangular, hexagonal, circular and elliptical, for example. The width of each island region 170 in the lateral direction (e.g., along the x-direction in FIGS. 1-3) may vary, for instance, from 10 nm to the maximum width of the source and drain contacts 140 and 150. The island regions 170 may all have the same or different widths. The distance between each island region 170 may vary from 0 to 100 µm, for example. Likewise, the length of each island region 170 may vary from 10 nm to the full distance between the source and drain contacts 140 and 150. The island regions 170 may all have the same or different lengths. The depth of each "island region 170 may vary from 1 nm to 500 µm in some embodiments.

The semiconductor device 100 may be fabricated from many different material systems, including but not limited to Si-based systems and group III-V materials, in particular group III-nitride based material systems. Group-III nitrides include the semiconductor compounds formed between nitrogen and the elements in Group-III of the periodic table, usually aluminum (Al), gallium (Ga), and indium (In). This group also includes ternary and tertiary compounds such as AlGaN and AlInGaN. Some particular materials that may be suitable include, by way of example, Si, GaAs, $Ga_2O_3$, $ZnO_2$, AlN, SiC, AlN, InN, GaN and diamond-based power and RF devices.

As previously mentioned, the semiconductor layer 110 may be a bulk semiconductor layer or it may comprise one or more sublayers formed on a substrate. By way of illustration, in some embodiments semiconductor layer 110 may be composed of $In_xAl_yGa_zN$ (0≤x≤1, 0≤y≤1, 0≤z≤1, x+y+z=1), SiC, $In_xAl_yGa_zAs$ (0≤x≤1, 0≤y≤1, 0≤z≤1, x+y+z=1), diamond, Si and/or oxide semiconductors such as $Ga_2O_3$, $ZnO_2$, either by themselves or in combination with other materials and/or heterostructures.

Barrier layer 120, which may comprise two or more sublayers, may comprise in some embodiments one or more layers of $In_xAl_yGa_zN$ (0≤x≤1, 0≤y≤1, 0≤z≤1, x+y+z=1), SiC, $In_xAl_yGa_zAs$ (0≤x≤1, 0≤y≤1, 0≤z≤1, x+y+z=1), diamond, $Si_xN_y$, $SiO_2$, $Ga_2O_3$, $ZnO_2$ and/or etch-stop layers formed by a combination of these materials. Dielectric layer 130 in some embodiments may comprise $Al_2O_3$, $Si_xO_y$, $Si_xN_y$, $Si_xO_yN_z$, Teflon, $HfO_2$, or any other dielectric with a dielectric constant below 200.

The gate electrode 160 may include conductive material including, for instance, amorphous, poly-crystalline, or crystalline semiconductors, metals or conductive oxides or dielectrics or a combination of these materials.

The island regions 170 differs from the surrounding semiconductor layer 110 and the barrier layer 120 in any one or more ways. For example, the island regions may differ from semiconductor layer 110 and the barrier layer 120 by having different doping types, doping levels, resistivity or material compositions including crystalline, poly-crystalline, amorphous semiconductors or dielectric material or any combination of different doping types, doping levels, resistivity and material compositions. The island regions 170 may be formed by ion implantation or by etching into the semiconductor layer and re-deposition of materials or by any combination of these and other methods. In some embodiments the island regions 170 may contain voids, without solid phase materials. For instance, as will be shown below in connection with FIG. 4(b) the island regions 170 may each incorporate a portion of a trench that is lined with various layers that define the individual island regions 170.

Figure 4A:
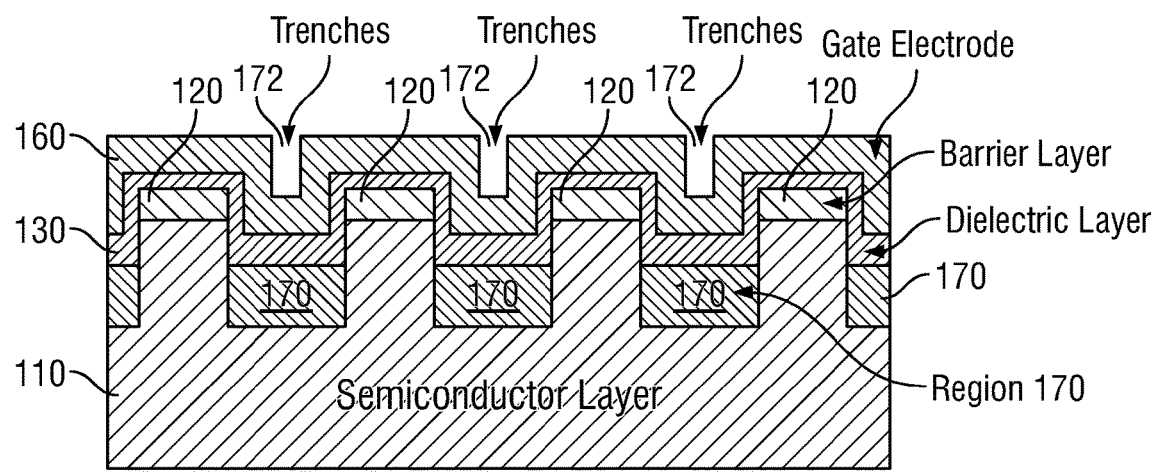
FIGS. 4(a)-4(d) show alternative embodiments of the semiconductor device taken along lines A-A' in FIG. 1.
Figure 4B:
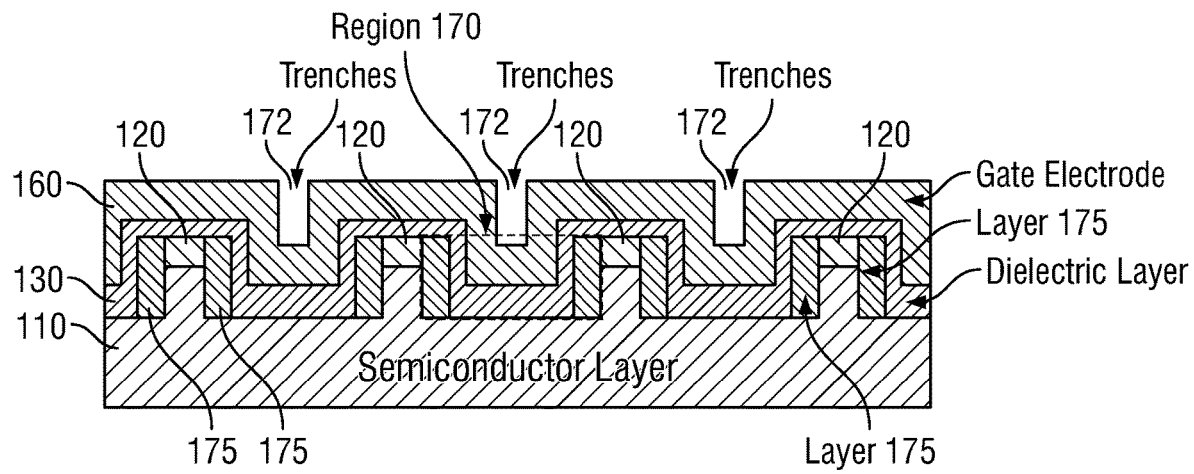

FIGS. 4a-4d show alternative embodiments of the invention along the lateral direction taken along lines A-A' in FIG. 1. While in the embodiment of FIG. 2 the top of the island regions 170 and the barrier layer 120 are in the same plane, in some embodiments such as shown in FIGS. 4a and 4b they may be in different planes (i.e., different depths).

Figure 5:
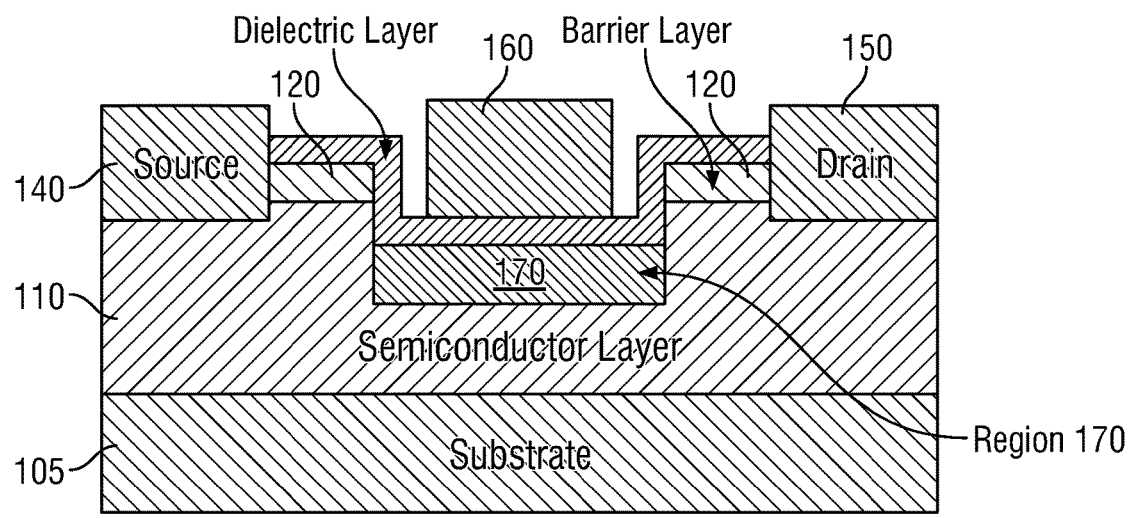
FIG. 5 shows the embodiment of FIG. 4(a) taken along lines B-B' in FIG. 1.

In the embodiment shown in FIG. 4(a), each island region 170 is formed at the bottom of a trench 172 located in the semiconductor layer 110. The trenches 172 may be lined or filled first with the dielectric layer 130 followed by the gate electrode 160. The barrier layer 120 may be located below the dielectric layer 130 between adjacent trenches 172 or between a trench and the source or drain contacts 140 and 150. FIG. 5 shows the embodiment of FIG. 4(a) taken along lines B-B' in FIG. 1. The gate electrode 160 may or may not fill the trench 172.

In the embodiment shown in FIG. 4(b), each island region 170, which is shown within the rectangle defined by the dashed lines, contains two layers 175 each lining a sidewall of trench 172 formed in the semiconductor layer 110. The layers 175 are different from the surrounding semiconductor layer 110 and barrier layer 120 by having different doping types, doping levels, resistivity or material compositions including crystalline, poly-crystalline, amorphous semiconductors or dielectric material or any combination of the different doping types, doping levels, resistivity and material compositions.

Figure 4C:
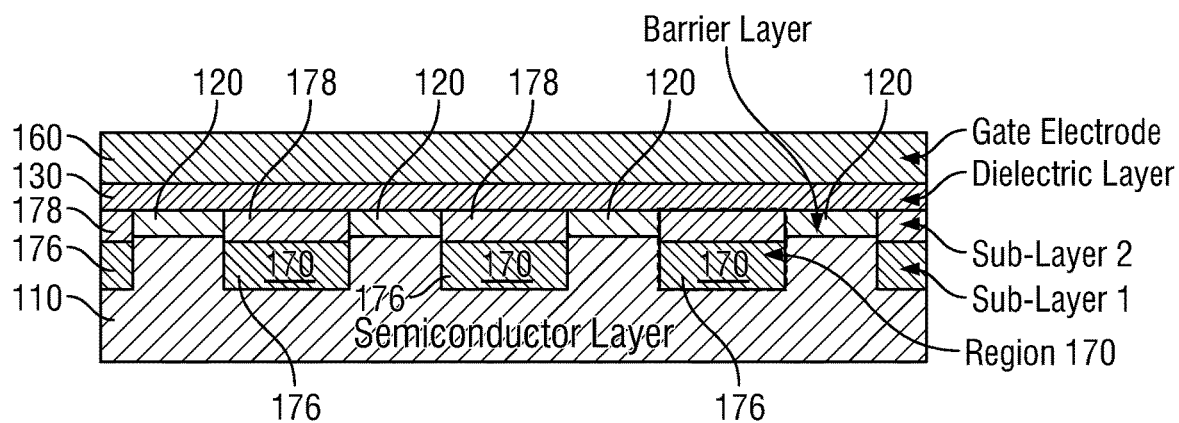
Figure 4D:
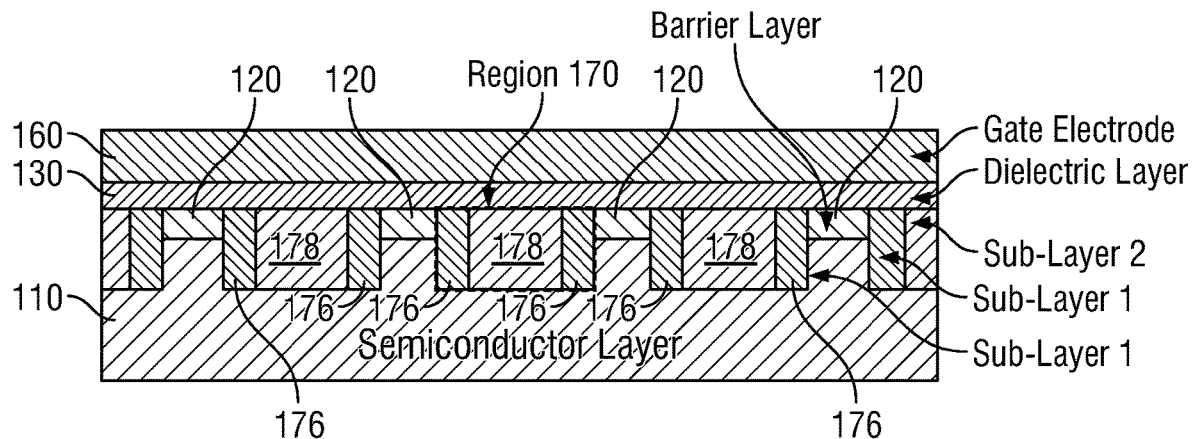

In some embodiments such as shown in FIGS. 4(c) and 4(d), each of the island regions 170 includes multiple sub-layers 176 and 178, where the sub-layer 176 and sub-layer 178 are different from the surrounding semiconductor layer and barrier layer in any one or more ways by having, for example, different doping types, doping levels, resistivity or material compositions including crystalline, poly-crystalline, amorphous semiconductors or dielectric material or any combination of the different doping types, doping levels, resistivity and material compositions. Similar to FIG. 4(b), island regions 170 in FIGS. 4(c) and 4(d) are shown within the rectangles defined by the dashed lines.

The interface between the sub-layer 176 and sub-layer 178 is along the horizontal direction as shown in FIG. 4(c) or along the vertical direction as shown in FIG. 4(d). In some embodiments, the interface between the sub-layers of island regions 170 is at an angle different from 0 and 90 degrees.

In some embodiments, each of the sub-layers 176 and 178 may include additional sub-layers.

In some embodiments, a portion of the barrier layer 120 in the gate region may be recessed and the dielectric layer 130 covers the recessed barrier layer 120 region. The gate electrode 160 disposed over the dielectric layer 130 may include conductive material including amorphous, polycrystalline, or crystalline semiconductors, metals or conductive oxides or dielectrics or a combination of these material. In the embodiments described above the source and drain contacts 140 and 150 and the gate electrode 160 are all formed on the same side of the semiconductor layer (i.e., the top side as seen most easily in FIG. 3) to define a lateral device. In other embodiments, at least one of the drain or source contacts 140 and 150 is formed on the opposite side of the semiconductor layer 110 from the gate electrode 160 to define a vertical device.

Figure 6A:
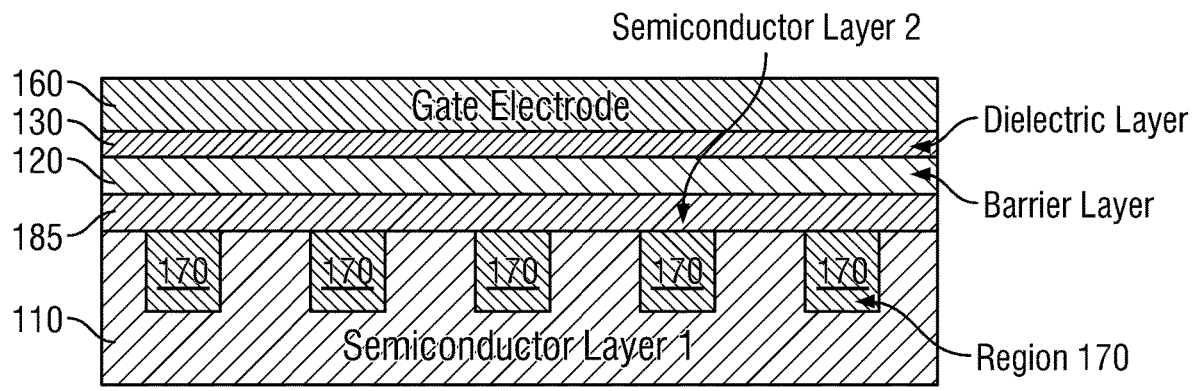
FIGS. 6(a)-6(c) show cross-sectional views of other alternative embodiments of the semiconductor device taken along line A-A' in FIG. 1.
Figure 6B:
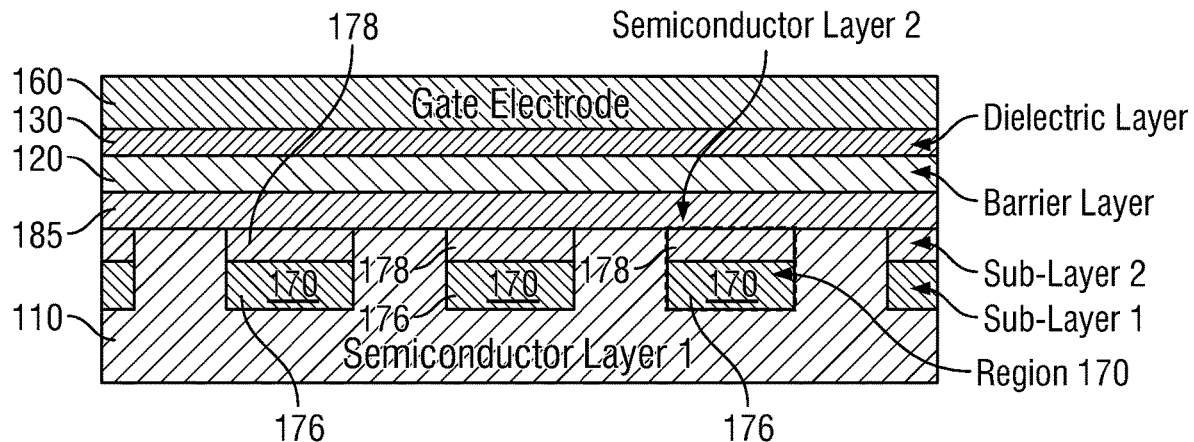
Figure 6C:
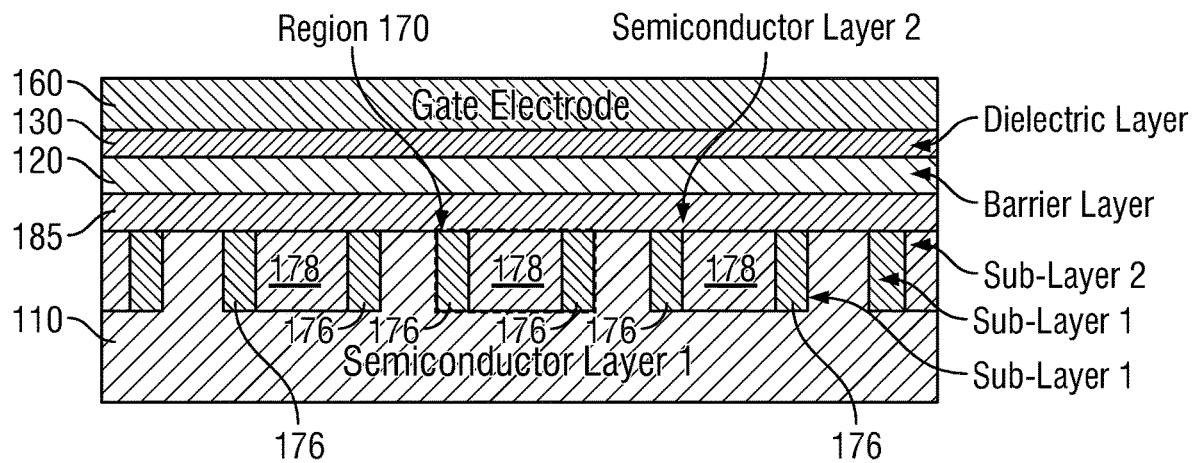
Figure 7A:
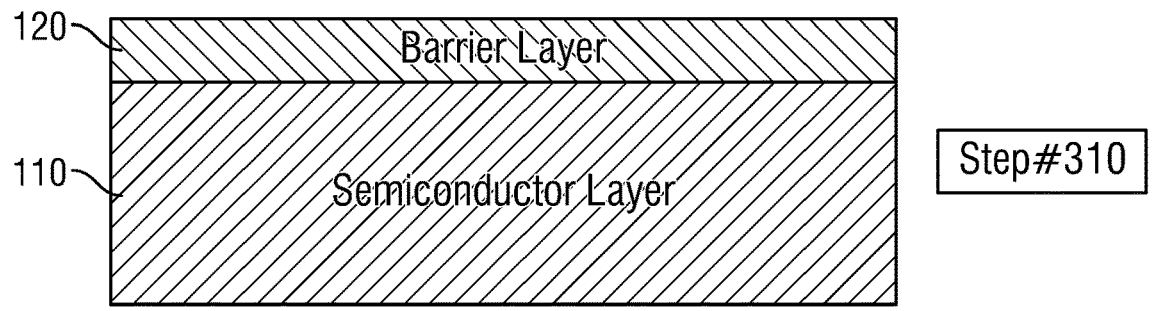
FIGS. 7(a)-7(d) shows a simplified example of the processing steps that may be employed to fabricate the embodiment of the semiconductor device shown in FIGS. 2-3.
Figure 7B:
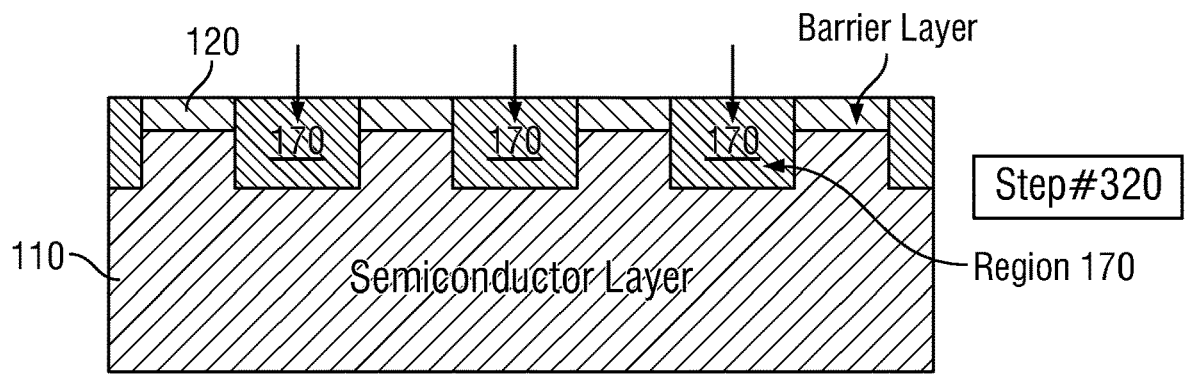
Figure 7C:
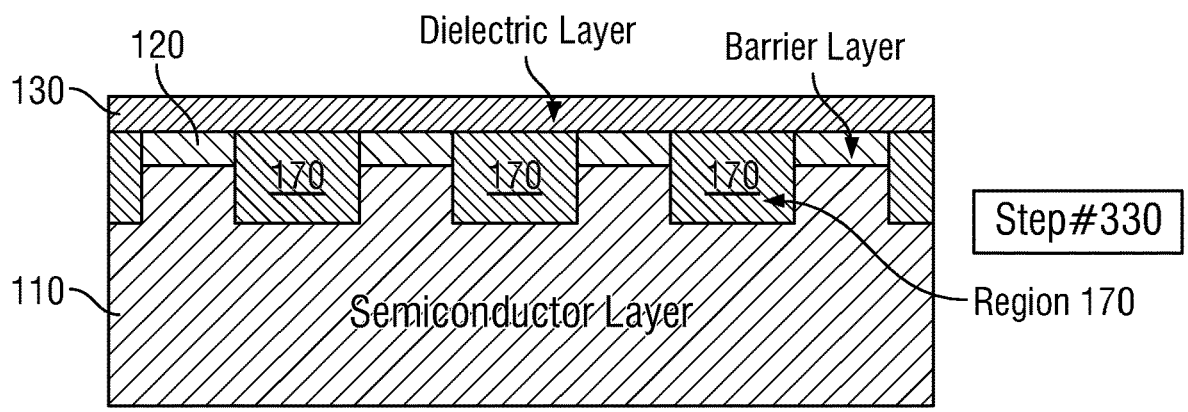
Figure 7D:
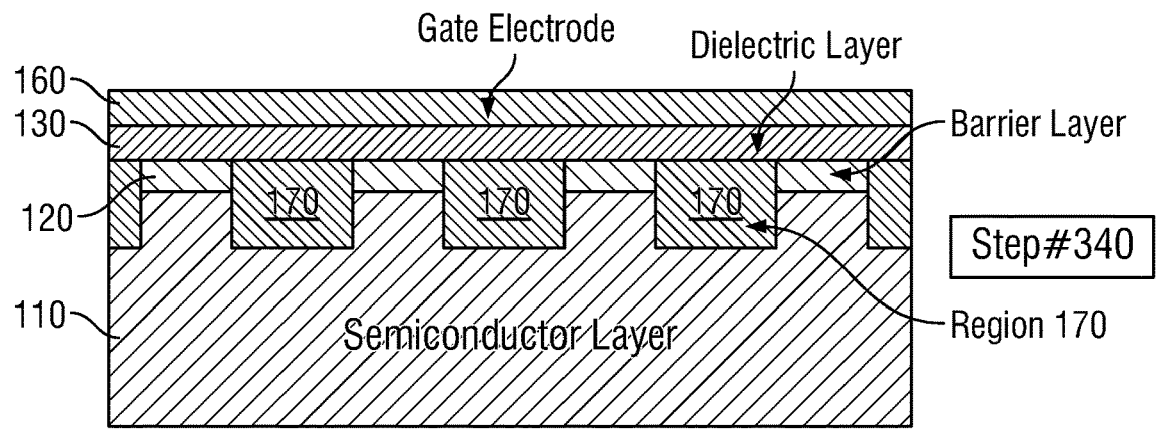
Figure 8A:
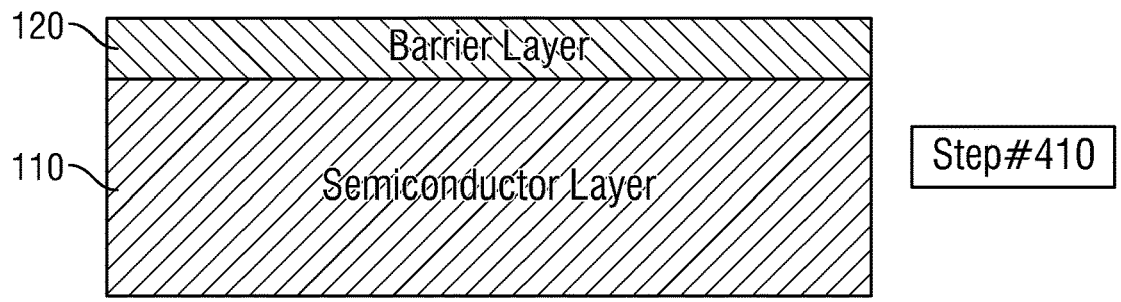
FIGS. 8(a)-8(e) shows a simplified example of the processing steps that may be employed to fabricate the embodiment of the semiconductor device shown in FIG. 4(a) in which the island regions are formed at the bottom of trenches.
Figure 8B:
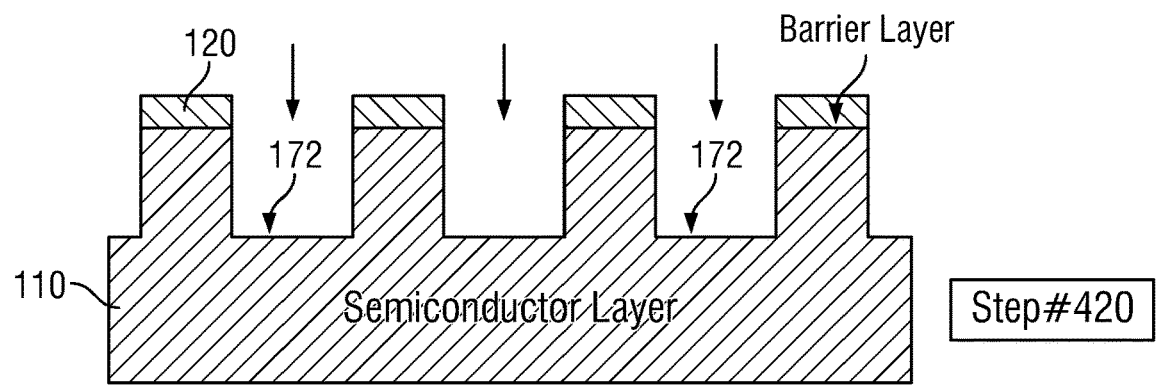
Figure 8C:
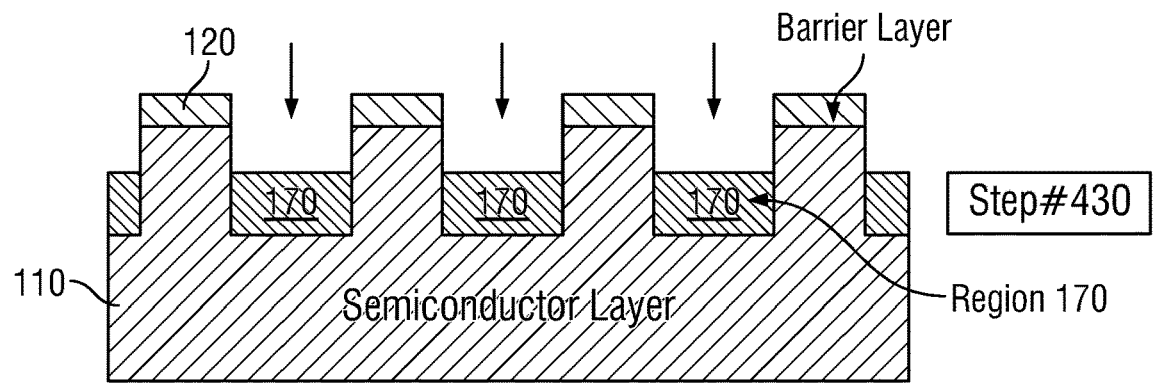
Figure 8D:
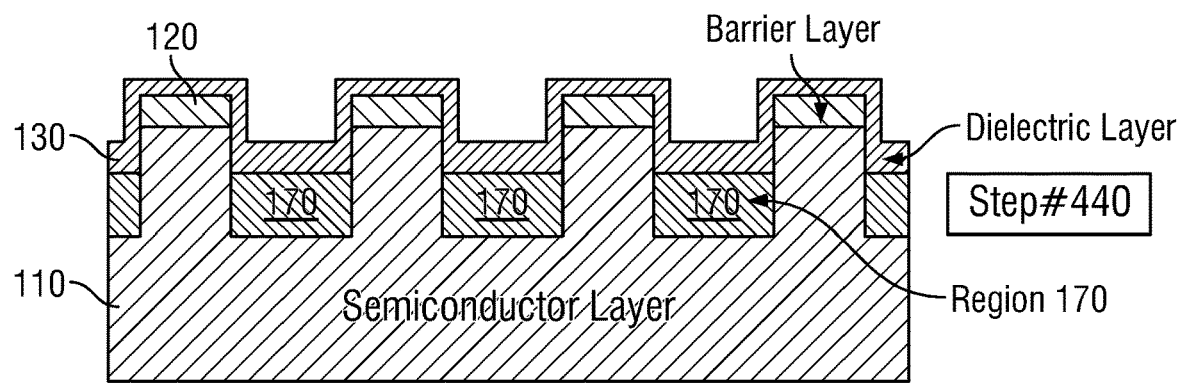
Figure 8E:
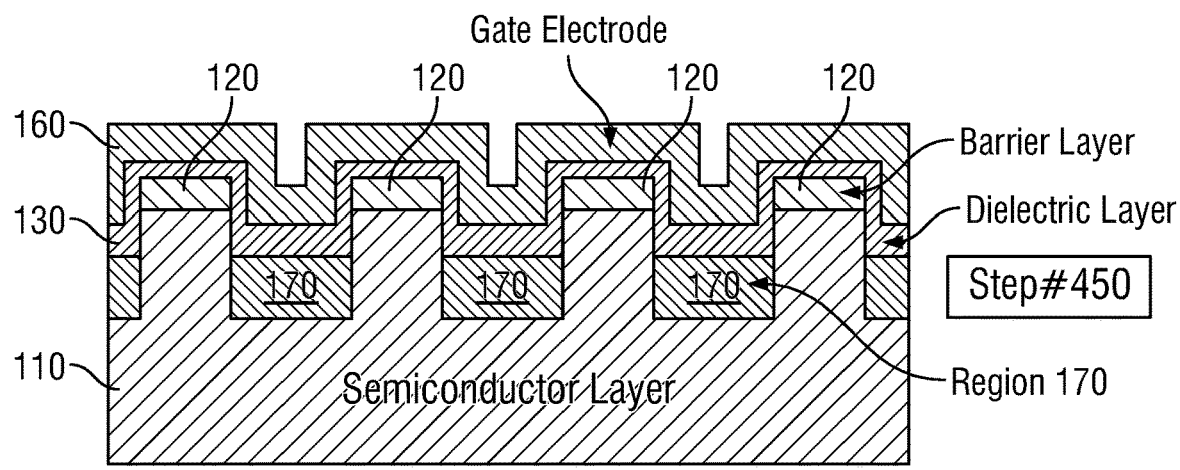

FIGS. 6(a)-6(c) show cross-sectional views of other alternative embodiments of the invention taken along line A-A' in FIG. 1. The island regions 170 in FIGS. 6(a)-6(c) are similar to those discussed above in connection with FIGS. 2, 4(c) and 4(d), respectively. The embodiments of FIGS. 6(a)-6(c), however, include an additional semiconductor layer 185 over or on semiconductor layer 110 and below barrier layer 120. The semiconductor layer 185 may or may not be located in whole or in part in the gate region shown in FIG. 1. Island regions 170 are located in the semiconductor layer 110 between the source contact 140 and drain contact 150 and are buried underneath the semiconductor layer 185.

The semiconductor layer 185, which is located over the island regions 170 and the semiconductor layer 110, may be formed by epitaxial growth or any other suitable method. The semiconductor layer 185 may be a single semiconductor layer or it may include two or more sub-layers. For example, in some embodiments the semiconductor layer 185 comprises $In_xAl_yGa_zN$ ($0 \leq x \leq 1$, $0 \leq y \leq 1$, $0 \leq z \leq 1$, $x+y+z=1$), SiC, $In_xAl_yGa_zAs$ ($0 \leq x \leq 1$, $0 \leq y \leq 1$, $0 \leq z \leq 1$, $x+y+z=1$), diamond, Si and/or oxide semiconductors such as $Ga_2O_3$, $ZnO_2$, either by themselves or in combination with other materials and/or heterostructures.

Due to the different compositional and/or structural differences (e.g., different doping types, doping densities, conductivities or material composition) between the island regions 170 and the surrounding layers in the various embodiments, the built-in potential or mechanical strain between the island regions 170 and the surrounding semiconductor layers shifts the Fermi-level of the semiconductor layers where the conduction channel is located. As a result, the threshold voltage of the transistor containing the island structure in the gate region is modulated. For example, if the semiconductor layer 110 is n-type, the island regions may be differ from the semiconductor layer 110 in being p-type, which will affect the Fermi-level and change the device threshold voltage. This structure can be applied to unipolar semiconductors to make normally-off/enhancement-mode transistors.

The semiconductor devices described herein may be fabricated using a wide variety of different fabrication techniques. For instance, low cost deposition techniques such as chemical vapor deposition (CVD), plasma enhanced chemical vapor deposition (PECVD), and reactive or conventional sputtering methods may be employed. The island regions may be structured, for example, using a $Si_xO_yN_z$-based hard mask combined with dry/wet etching. As a further alternative, other growth methods, such as molecular beam epitaxy (MBE) or atomic layer epitaxy may be used.

Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HYPE), Atomic Layer Deposition (ALD), and Physical Vapor Deposition (PVD). Standard metallization techniques, as known in the art of semiconductor fabrication, can be used to form the electrodes.

FIGS. 7(a)-7(d) shows a simplified example of the processing steps that may be employed to fabricate the embodiment of the invention shown in FIGS. 2-3. First, in step 310 of FIG. 7(a) barrier layer 120 is deposited on semiconductor layer 110, which, as previously mentioned, may be an epitaxial layer formed on a substrate (not shown) or it may itself serve as the substrate. Next, in step 320 of FIG. 7(b) an implantation step is performed using suitable masks and the like to form the island regions 170 that extend through the barrier layer 120. Of course, island regions 170 may be formed by alternative techniques as well. For instance, trenches may be formed in the semiconductor 110 using an etching process, followed by deposition into the trenches of the material(s) that define the island regions 170. Dielectric layer 130 is then formed in step 330 of FIG. 7(c) over the barrier layer 120 and the exposed surface of the island regions 170, followed by deposition of the gate electrode 160 in step 340 of FIG. 7(d). Finally, although not shown, source and drain regions and optional passivation layers may be formed in a conventional manner to complete the fabrication of the semiconductor device 100.

FIGS. 8(a)-8(e) shows a simplified example of the processing steps that may be employed to fabricate the embodiment of the invention shown in FIG. 4(a) in which the island regions 170 are formed at the bottom of trenches 172. First, in step 410 of FIG. 8(a) barrier layer 120 is deposited on semiconductor layer 110, which, as previously mentioned, may be an epitaxial layer formed on a substrate (not shown) or it may itself serve as the substrate. Next, in step 420 of FIG. 8(b) trenches 172 are formed through the barrier layer 120 and into the semiconductor layer 110 by etching methods using suitable masks and the like. An implantation or deposition step is then performed to deposit island regions 170 through the bottom of the trenches 172 in step 430 of FIG. 8(c). Dielectric layer 130 is then formed in step 440 of FIG. 8(d) over the barrier layer 120 and in the trenches 172 over the island regions 170, followed by deposition of the gate electrode 160 in step 450 of FIG. 8(e). Finally, although not shown, source and drain regions and optional passivation layers may be formed in a conventional manner to complete the fabrication of the semiconductor device 100.

As previously mentioned, the structures described herein may be employed in a number of different semiconductor devices. For instance, in addition to transistors, it may be incorporated into diodes. Similar to the transistor structures shown above, the anode (or in some cases the cathode) of such a diode will cover at least a portion of the island regions. The island regions themselves may be as described above. The anode will make electrical contact with the semiconductor layer underneath it. The different compositional and/or structural differences between the island regions and the surrounding semiconductor layers changes the diode junction capacitance and reverse leakage current.

The above description of illustrated examples of the present invention is not intended to be exhaustive or limited to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

The invention claimed is:

1. A semiconductor structure, comprising:
   a source contact;
   a drain contact;
   a semiconductor region formed from a first Group-III nitride, the semiconductor region being located between the source and drain contacts;
   a barrier layer located on the semiconductor region and formed from a second Group-III nitride, the barrier layer contacting the source and the drain, the barrier layer forming a heterostructure with the semiconductor region;
   a plurality of island regions located in the semiconductor region and not in the barrier layer, the island regions each extending in a lateral direction and a second direction orthogonal to the lateral direction without extending to the source and drain contacts, the island regions extending in the lateral direction such that adjacent ones of the island regions are separated from one another by portions of the semiconductor region, each of the island regions differing from the semiconductor region and the barrier layer in one or more characteristics selected from the group including resistivity, doping type, doping concentration, strain and material composition;
   a plurality of trenches each extending into the semiconductor region and through the barrier layer such that the barrier layer is excluded from the trenches, the island regions each being located at least at a bottom of a different one of the trenches; and
   a gate electrode covering a least a portion of the island regions being located between the source and drain contacts; and
   the island regions each extending beyond both a source-side and a drain-side of the gate electrode.

2. The semiconductor structure of claim 1 wherein the semiconductor region further includes at least one additional material and/or heterostructure.

3. The semiconductor structure of claim 1, wherein the second semiconductor layer is located on the semiconductor region and covers at least a portion of the island regions.

4. The semiconductor structure of claim 1, wherein the barrier layer has a recessed region under the gate electrode.

5. The semiconductor structure of claim 1 wherein a surface of the semiconductor region extends in a first plane and the island regions comprise a plurality of sub-layers, wherein an interface between each of the sub-layers extends in the first plane or a second plane orthogonal to the first plane, or at an angle with respect to the first plane that is different from 0 and 90 degrees.

6. The semiconductor structure of claim 1, wherein the gate electrode comprises one or more conductive materials selected from the group including metals, amorphous, polycrystalline, crystalline semiconductors or conductive oxides and dielectric materials.

7. The semiconductor structure of claim 1, further comprising one or more dielectric layers located between the conductive electrode and the surface of the semiconductor region.

8. The semiconductor structure of claim 7, wherein the dielectric layer comprises $Al_2O_3$, $Si_xO_y$, $Si_xN_y$, $Si_xO_yN_z$, Teflon, $HfO_2$, or any other dielectric with a dielectric constant below 200.

9. The semiconductor device of claim 1 wherein a top of the barrier layer is not flush with a top of the at least one island region.

* * * * *